United States Patent [19]

Weakliem et al.

[11] 4,450,787
[45] May 29, 1984

[54] GLOW DISCHARGE PLASMA DEPOSITION OF THIN FILMS

[75] Inventors: Herbert A. Weakliem, Pennington; John L. Vossen, Jr., Bridgewater, both of N.J.

[73] Assignee: RCA Corporation, New York, N.Y.

[21] Appl. No.: 386,686

[22] Filed: May 29, 1984

[51] Int. Cl.³ ............................................. C23C 13/08
[52] U.S. Cl. ..................................... 118/723; 118/50.1
[58] Field of Search .................................. 427/39–41; 118/723, 50.1

[56] References Cited

U.S. PATENT DOCUMENTS

| 3,526,584 | 9/1964 | Shaw | 204/192 |
| 3,962,988 | 6/1976 | Murayawa et al. | 118/723 |
| 4,317,844 | 3/1982 | Carlson | 427/39 |

OTHER PUBLICATIONS

"Glow Discharge Phenomena in Plasma Etching and Plasma Deposition" by J. L. Vossen, *Journal of the Electrochemical Society*, Feb. 1979, pp. 319–324.

*Primary Examiner*—Evan K. Lawrence
*Attorney, Agent, or Firm*—Birgit E. Morris; Donald S. Cohen; Joseph D. Lazar

[57] ABSTRACT

A glow discharge plasma reactor for deposition of thin films from a reactive RF glow discharge is provided with a screen positioned between the walls of the chamber and the cathode to confine the glow discharge region to within the region defined by the screen and the cathode. A substrate for receiving deposition material from a reactive gas is positioned outside the screened region. The screen is electrically connected to the system ground to thereby serve as the anode of the system. The energy of the reactive gas species is reduced as they diffuse through the screen to the substrate. Reactive gas is conducted directly into the glow discharge region through a centrally positioned distribution head to reduce contamination effects otherwise caused by secondary reaction products and impurities deposited on the reactor walls.

6 Claims, 2 Drawing Figures

GLOW DISCHARGE PLASMA DEPOSITION OF THIN FILMS

The Government of the United States of America has rights in this invention pursuant to SERI subcontract XG-O-9372-1.

This invention relates to plasma deposition utilizing a glow discharge to deposit thin films of material, and more particularly, to a glow discharge that is excited by radio frequency (RF).

BACKGROUND OF THE INVENTION

Thin films may be deposited on substrates placed in reactor systems in which a reactive plasma is produced by either a DC or RF excited so-called glow discharge. A discharge is maintained by the creation of sufficient numbers of ions and electrons to balance those lost by various processes, the primary loss being charged particle recombination at the electrodes of the reactor system. There are two mechanisms available in RF glow discharges for the production of electrons sufficiently energetic to cause impact ionization of a neutral gas, whereas only one of these mechanisms is operative in DC glow discharges: (1) Electrons may absorb energy from the RF field by elastic collisions and (2) secondary electrons may be emitted from reaction chamber surfaces which are bombarded by charged particles. These secondary electrons gain energy by acceleration through the so-called sheath potential near such surfaces. Only the latter mechanism, however, is operative in a DC glow discharge system.

RF glow discharge systems provide an excitation mechanism that enables the operation of the glow discharge not only over a wide range of pressures of the reactive gases, but also at relatively low electrical fields, and furthermore in relatively large volumes. Any one or all of these conditions make RF glow discharge systems useful and attractive in the preparation of large area thin film devices.

Reactive glow discharges from which such films may be deposited can be excited by RF by means of a coil wrapped externally about the reaction chamber, by capacitive plates that are disposed external to the reactor, as well as by internal electrodes. The plasma generated in such RF reactors with internal electrodes tends to be more nonuniform than for reactors in which the electrodes are placed external to the reactor. The plasma in such external electrode reactors tends to be confined to the walls near the elements. However, uniform large area films can be deposited from systems utilizing internal electrodes of planar form. One form of planar electrode utilizing magnetron principles may be employed to achieve an increased deposition rate. However, the active plasma zone in such systems is still nonuniform. See the paper by J. L. Vossen titled, GLOW DISCHARGE PHENOMENA IN PLASMA ETCHING AND PLASMA DEPOSITION, *Journal of the Electrochemical Society*, Vol. 126, No. 2, Feb. 1979, for a more detailed description of plasma reactors.

One problem that exists in glow discharge plasma deposition systems, whether they be of the DC or RF excited type, is the damage that occurs to the deposited films caused by charged particle bombardment resulting from the glow discharge. This problem becomes particularly acute as the glow discharge region extends into the surface of the substrate upon which the films are being deposited. One method for attempting to reduce the harmful effects of glow discharge deposition is to position the substrate in a region remote enough from where the glow discharge by D.C. voltages is developed, that is, where a D.C. voltage is applied between the plate and cathode of the system. This is achieved by arranging the cathode with a planar screen electrode such as to pass the ionized particles developed by the glow discharge through the screen and onto a substrate. Such a system is described in U.S. Pat. No. 4,317,844, issued on Mar. 2, 1982, to D. E. Carlson, entitled, SEMICONDUCTOR DEVICE HAVING A BODY OF AMORPHOUS SILICON AND METHOD OF MAKING THE SAME. Moreover, the Carlson patent describes the use of RF power to energize the planar screen electrode through which positive ions are passed to the substrate.

SUMMARY OF THE INVENTION

A plasma deposition reactor apparatus capable of generating a radio frequency (RF) glow discharge is provided with a perforated screen electrically connected to the anode of the reactor system and positioned between the anode and the cathode thereof. The screen confines the glow discharge to the region between the cathode and the screen. The substrate on which the film is to be deposited from a conducting reacting gas is positioned near the screen but not in the glow discharge region. Reactive gas is introduced into the central portion of the reactor between the perforated screen and the cathode. The kinetic energy of charged particles which may be deposited on the substrate is significantly reduced. Accordingly, damage to the film on the substrate is thereby significantly reduced.

DETAILED DESCRIPTION OF THE PREFERRED EMBODIMENTS

Figure 1:
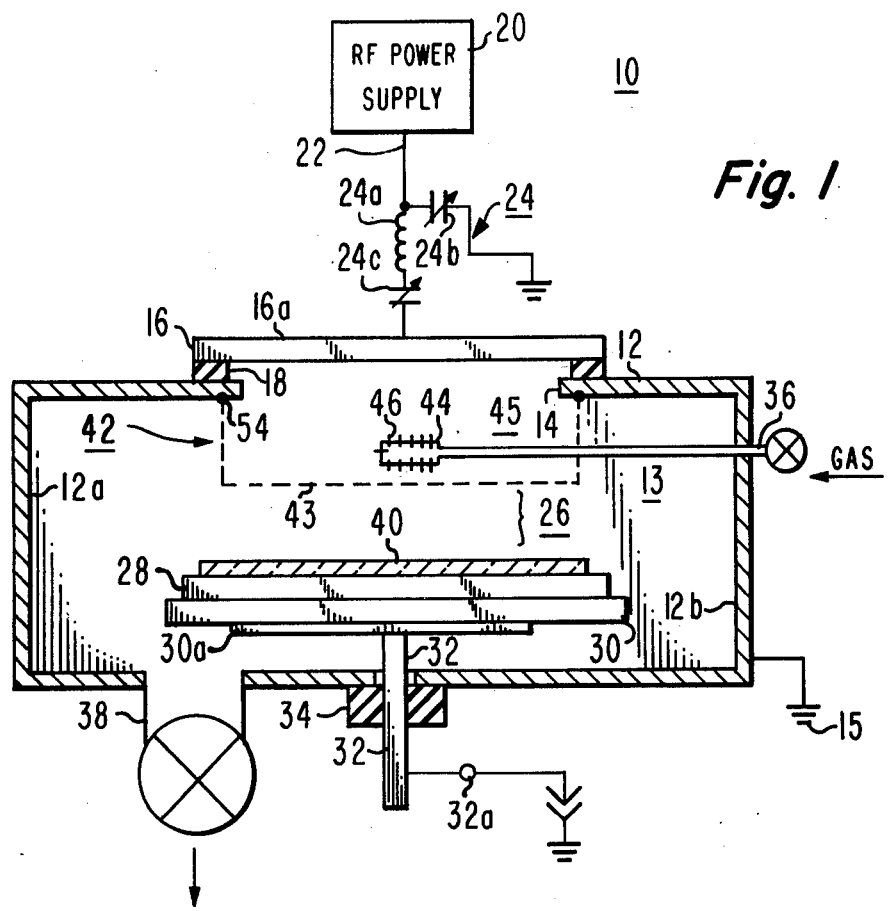
Figure 2:
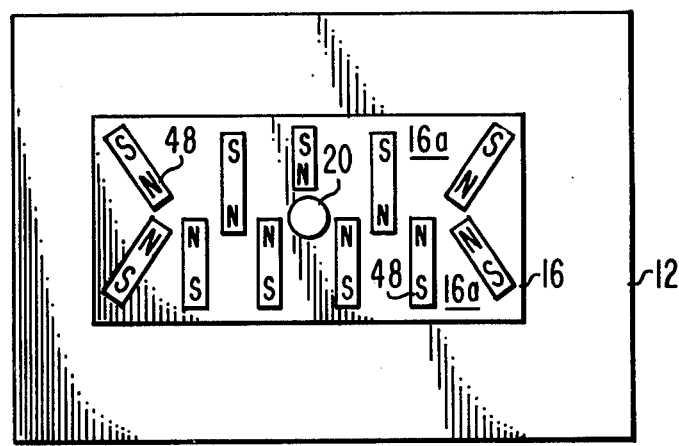

The detailed description of the embodiments of the invention to follow shall make reference to the drawing in which:

FIG. 1 is a schematic of an apparatus according to one embodiment of the invention; and FIG. 2 is a schematic of a modification of FIG. 1 as a planar magnetron reactor.

A typical RF planar electrode deposition system 10 useful in practicing the invention is illustrated in FIG. 1. A hollow reactor housing 12 formed of conductive materials defines the vacuum chamber 13 therein. The housing 12 of the reactor has an aperture 14 over which is placed a metallic plate member 16 serving as the cathode of the system. An annular seal 18 provides electrical isolation between the anode 16 and the housing 12. An RF power supply 20 is electrically connected to the cathode 16 by a bus 22 through an impedance matching network 24. The network 24 is of conventional form comprising tuneable LC component elements 24a and 24b, respectively, as well as a blocking capacitor 24c. The network is tuned to the impedance of the plasma generated within the chamber in a manner as well known in the art. The substrate 28 upon which the film material is to be deposited is supported on a planar metallic support member 30, which in turn is positioned within the chamber 13 by a metallic post 32. The housing 12 is grounded as at ground 15 of the system.

The substrate support member 30 is, in one arrangement, electrically isolated from the power supply 20 by an insulating seal 34. In the alternative, the substrate 28 on support member 30 may be grounded as by connection at terminal 32a to reference ground.

Reactive gas is introduced into the chamber 13 via an inlet port 36 in the wall of the housing. The pressure of the gas, such as silane, is then about 0.020 Torr. Chamber 13 is maintained to a pressure usually in the range of 0.01 Torr–1.0 Torr by connection to a throttled vacuum pump via outlet 38.

The apparatus of conventional form as just described effects a gaseous plasma within the chamber 13 when the RF power supply 20 provides energy to the system. The plasma is visibly seen as a glow discharge. The extent of the glow discharge is substantially throughout the chamber 13, since the cathode 16 provides a field of energy to the entire wall surface of the housing 12 which is grounded and serves in conventional systems as the anode. Thus the housing 12, is a counter electrode serving as the anode of the system and the plate 16 coupled to the RF power supply 20 serves as the cathode of the system. Plasma effected by the ionization of the silane gas, for example, causes silicon to be deposited on the surface of the substrate 28 to be developed as a film 40 of silicon. The support member 30 may be provided with suitable heating means well known in the art, such as inductive or resistive heating elements 30a, to heat the substrate to a desired temperature. As known in the art, the properties of the deposited film are a function of the substrate temperature.

All surfaces within the chamber 13 in contact with the glow discharge are subject to positive ion bombardment. The potential of the plasma itself has both a DC and an RF component and the DC plasma potential is more positive than any other surface or electrode in the chamber 13. If the RF power supply 20 is coupled through the matching network 24 to the electrode 16 with the blocking capacitor 24c, the electrode 16 acquires a DC potential which is negative with respect to the reference ground 15. It is for this reason that the electrode 16 is termed or designated the cathode. Moreover, the magnitude of the DC cathode potential, and the average plasma potential are functions of the relative areas of the cathode 16 and the ground plane connected to housing 12, which serves as the anode. Since all surfaces in contact with the RF excited glow discharge have DC potentials more negative than that of the plasma, they are subject to ion bombardment caused by the acceleration of the ions across the potential difference between the plasma and the corresponding surface, that is either cathode 16, or grounded anode 12. Furthermore, grounded and electrically floating surfaces, if any, within the chamber 13 are subject to electron bombardment during part of the half-cycle when the RF potential from the power supply 20 at the surfaces is more positive than the average DC potential at such surfaces. See the text, "Thin Film Processes", edited by J. L. Vossen and W. Kern, Academic Press, 1978, particularly pages 28–29, which describes in greater detail the phenomenon of the ion bombardment effects in an RF-excited glow discharge reactor.

The operation of the reactor as described thus far is conventional. The essential point to understand is that conventional glow reactors develop a visible glow of ionized gas within the plasma and that the glow extends substantially throughout the region defined by the anode and cathode of the system. The substrate positioned somewhere within the glow discharge region is thus exposed to the high energy charged particle bombardment.

Thus, the film 40 which is deposited on the substrate 28 in conventional systems is subject to this bombardment of charged particles which may damage the film. The positive ion flux to the film may be retarded slightly by the application of a positive potential to the substrate 28. However, the application of a positive potential to substrate 28 in contact with the glow discharge has the effect of raising the plasma potential, which, in turn, increases the accelerating voltage between the plasma and all metallic surfaces within the chamber 13 having potentials less than that of the substrate 28. This increased accelerating voltage increases the probability of undesirable sputtering of the metallic material from the surfaces.

According to the present invention, the difficulties and problems that occur in a conventional glow discharge system as described hereinabove can be overcome to a great degree by confining the RF field to a region or portion within the reactor chamber to thereby confine the glow discharge of a gaseous plasma in such a region and isolate damaging specie from the film on the substrate. This is achieved by a perforated metallic surface 42 having a screen portion 43 formed to encompass entirely the portion of the cathode 16 exposed to the chamber 13. The surface 42 is electrically connected to the system ground 15 and serves to limit the RF field to the region 45 defined between the surface 42 and the cathode 16. The glow discharge is thus substantially confined to the region 45. The surface 42, which in this embodiment is generally a parallelepiped, is perforated throughout as a screen and has a perforation ratio or transmission of about 0.6, meaning that about 60% of the screen is transmissive to particles. Any form of a screen may be used as required. In one embodiment, the screen surface formed of stainless steel is provided with individual holes 0.15 inch (0.38 cm) in diameter, each hole separated from the other by approximately 0.18 inch (0.46 cm). Moreover, the holes are arranged in a closely packed configuration. Screen surface 42 is connected to the inner wall of the housing 12 beyond the edges as shown, by about 0.5 inch (0.25 cm), and the bottom screen surface portion 43 of the screen surface 42 is spaced from the cathode by about 2 inches (5.1 cm) and is parallel to the plane of cathode 16. Electrical contact to ground 15 via housing 12 is made at terminal 54. The substrate 28 is spaced from the bottom screen portion 43 by about 1 inch (2.54 cm).

The screen surface 42 tends to confine the plasma generated in response to the RF energy in the chamber 13 to the region 45 between the screen surface 42 and cathode 16, while allowing some charged particles and other activated species to penetrate and pass through the apertures of the screen into the chamber 13 at reduced energy. Diffusion of the activated species from the confined glow discharge to the heated substrate results in a deposition of the diffused species on the substrate surface 28. The process of the specie of the gas diffusing to the substrate 28 within a substantially zero potential field results in the particles arriving with much less kinetic energy than particles in the environment of the high energy fields of the conventional reactors as described hereinabove. The reason the particles passing through the screen 43 are at reduced energy level is because the RF outside of region 45 is virtually zero. Thus, the surface of the film is not damaged by the bombardment of high energy particles.

The reactive gas is introduced in the chamber according to a feature of the invention within the region 45 defined by the screen 42 and the cathode 16. Introduction of the gas into the center of the region 45, and thus in the center of the reactive glow discharge region, tends to minimize the introduction of impurities in the deposited films. Impurities may arise from deposition of species from the walls of the system or other internal components. Impurities may also arise from sputtering of the cathode.

A preferred form of the gas inlet to the region within the screen surface 42, is a flat disc 44 that is generally a hollow flat cylinder of about 1 inch (2.54 cm in diameter) and a height of 0.25 inch (0.6 cm) having about 12 holes 46 each about 0.050 inch (0.127 cm) in diameter. The purpose of the disc 44 is to provide a dispersion of the gas substantially uniformly within the central portion of the glow region 45. As the ions of silicon from silane, for example, are diffused from the glow discharge region 45, their density and kinetic energy are reduced as they approach the vicinity of the substrate 28.

In order to understand this kinetic energy phenomenon, one must consider the electric fields established between the plasma of a glow discharge and surfaces in contact with that plasma. In general, the plasma of the glow discharge, which is composed of nearly equal amounts of ions and electrons, has a potential $V_p$, called the plasma potential, which is the most positive potential in the entire electrical system of electrodes and plasma. All surfaces, whether metallic or not, in contact with the glow discharge, develop a sheath of charge whose density and extent determines the flux and kinetic energy of ions to the surface. Positive ions are accelerated from the sheath to the surface by a d.c. potential gradient $V_a$ represented as follows:

$$V_a = V_p - V_s \qquad (1)$$

where $V_p$ is the plasma potential in the vicinity of the surface whose potential is $V_s$. Assuming no collisions from the sheath to the surface, the ions of charge q acquire a momentum and additional kinetic energy by the accelerating potential $V_a$. If the ion recombines upon collision with the surface, some of the ion kinetic energy $qV_a$ and the momentum is transferred to the surface, and the processes of dissipating the excess energy and momentum by the surface may cause damage to that surface. In the absence of the screened surface 42, the sheath potential is established to the surface of substrate 28. Accordingly, the kinetic energy of the particles, deposited on the surface 28 to develop the film 40, are provided with the kinetic energy $qV_a$. These high energy particles are the source of damage to the film 40. By providing the screened surface 42 electrically connected to the sheath potential, as described hereinabove, a sheath potential $V_a$ is established along the surface of surface 42. There is virtually no sheath potential at the surface of substrate 28 since substrate 28 is virtually in a zero potential field.

In the operation of the reactor with screen surface 42 in position, when the reactive gas is exposed to the RF field and is decomposed thereby, the charged particles will achieve a kinetic energy $qV_a$ as they pass through the screen portion 43. Since the electric field in the region outside of region 45, particularly region 26, is at virtually zero potential, the kinetic energy of the particles passing through that region and eventually onto substrate 28 are at reduced kinetic energy due to ion molecule collision in the gas in the manner well known in this art. It should be understood that the phenonemon discussed considers the charge particles to be positive ions and electrons.

It should be noted that the plasma potential $V_p$ has an AC component of the form $V_o \sin \omega t$, where $\omega$ is the operating frequency of the power supply 20. The screen surface 42, being grounded via terminal 54 on the wall of housing 12 to ground 15, also serves to shield the substrate 28 from the RF field from the power supply 20. Thus, there is a reduction in the flux of charged particles which occurs on alternating half cycles.

If the film 40 grows on the substrate 28 by the known mechanism of an ion-surface recombination, the growth rate of the film will be less when a screen 42 is used since a fraction of the ions and other excited species recombine on collision with the solid segments of the screen and thus are lost. However, if the growth mechanism of the film 40 is based on a free radical reaction, that is, an excited molecule-surface reaction, a more common mechanism than the one referred to above, namely, the ion-surface recombination mechanism, the growth rate using this invention may not be reduced by a factor equal to the transmission, that is, the perforation ratio, of the screen 42. More detailed discussion of these phenomena is described in, "Techniques and Applications of Plasma Chemistry," Eds. J. R. Hollahan and A. T. Bell, J. Wiley and Sons, New York (1974).

Some of the ions and electrons which do penetrate outwardly from the screen surface 42 may have sufficient energy to excite other molecules of the gas in the remaining portion of region 13. Thus, an effectively new source of reactive species may be created in the vicinity of substrate 28 serving to partially replenish those lost by recombination at the screen 42, particularly at the bottom surface portion 43.

There are certain conditions or requirements that are desirable for a screen 42 as described hereinabove according to the present invention. First, the transmission (i.e., the ratio of the opening of the apertures to the entire area) should be high in order to enhance the number of excited film-forming species of the reactive gas developed by the glow discharge to penetrate to the space 26 between the screen portion 43 of screen surface 42 and the substrate 28. Second, the individual openings of the screen surface 42 should be small enough so they do not unduly disturb the plasma boundary. Openings that are too large in the screen surface 42 will cause a collapse of the plasma boundary which in turn results in excessive ion and possibly RF field penetration to the space 26. Moreover, the openings in the screen surface 42 should be less than the plasma-to-screen sheath thickness, that is, the potential sheath located at the surface of the growing film 40, which sheath may be estimated by the well known Child-Langmuir equation:

$$j = \frac{1}{9\pi} \left( \frac{2q}{M_+} \right)^{1/2} \frac{V^{3/2}}{d^2} \qquad (2)$$

where j is the positive ion flux in amperes cm$^{-2}$, $M_+$ is the average positive ion mass, V is the plasma-to-screen (sheath) potential in volts and d is the sheath thickness in centimeters.

In addition to the requirements and conditions of the form of the screen surface 42 and its relation to the substrate 28, the substrate 28 itself should be placed for near-optimum performance close to the screen portion 43 so that the maximum number of excited film-forming species are present. In other words, the spacing of the screen 43 and the substrate 28 should be of the order of the mean free path of the film-forming species for de-excitation. Since the value of this quantity is almost never known, the ideal or optimum position must be determined experimentally for each application of the invention. The substrate 28 also should be placed far enough from the screen surface 42 to minimize the effect of "shadowing" owing to the alternate openings and opaque regions of the screen surface 42. If the substrate 28 is placed a distance corresponding to a few mean free paths from the screen surface 42, the particle directions will have been randomized by collision but will not be completely lost by so-called "volume recombination," otherwise known as de-excitation of the particles to a non-excited state and thus to a non-reactive state.

As indicated above, introduction of gas via the inlet 36 and disc 44 within the center of the plasma region 45 bounded by the cathode 16 and the confinement screen surface 42 according to this invention tends to minimize the presence of impurities which may arise from secondary wall reactions and outgassing at remote surfaces. Moreover, this gas flow outward from region 45 tends to minimize the possible occurence of gas phase nucleation which produces unwanted powders or polymers which precipitate from the volume. This is achieved according to the invention by reducing effectively the residence time of the reactive gas in the active glow discharge plasma region by the centrally disposed discharge disc 44.

We have used the preferred embodiment described hereinabove to prepare films of hydrogenated amorphous silicon (a-Si:H). Films were prepared both with and without the central gas inlet disc 44 and both with and without a screen 42 using a variety of plasma conditions. The cathode, namely the plate 16, had a dimension of 7 by 11 inches (17.5 by 28 cm). An array of permanent magnets, in some experiments, were placed over the cathode 16, as shown in FIG. 2, to be described. The magnetic pattern over the cathode 16 effectively made the equipment into what is known as a planar magnetron glow discharge system. The magnetron system aids in confining by a magnetic flux the plasma to a ring-shaped region parallel to the cathode 16 within region 45. Without the magnets as shown in FIG. 2, the system operates in what is known as an asymmetric diode glow discharge mode. See, for example, the above-identified Vossen text at Chapters II-1 and II-4 for a description of such reactors.

In the performance of the experiments, pure silane discharges at the disc 44 were at pressures less than 0.050 Torr, and an RF power density less than 0.2 watt $cm^{-2}$ for the asymmetric diode glow discharge mode. The pressures were less than 0.015 Torr and the RF power less than 0.2 watt $cm^{-2}$ for the magnetron mode (FIG. 2).

FIG. 2, as just indicated, shows the modification of the reactor 10 of FIG. 1 into a planar magnetron reactor. This is achieved with, for example, 12 bar magnets positioned on the upper surface 16a of the cathode 16 to effect a closed-loop magnetic field that extends down into the chamber 13, particularly into the region 45 within the screen surface 42. Various configurations of magnets may be used depending on the reactor design chosen. See "Planar Magnetron Sputtering," pp. 131-173, of the above-identified text, "Thin Film Processes," for a description of planar magnetron configurations that are useful in the practice of this invention. The sheath thickness of the potential was estimated in both modes to be 3 to 4 millimeters according to Equation (2) above.

The quality of the hydrogenated amorphous silicon films made in the performance of this invention was determined by the value of the diffusion length by measurements of the reverse bias surface photovoltage (SPV) according to the techniques disclosed in the commonly-assigned copending application of A. Moore, U.S. Ser. No. 280,918, filed July 6, 1981, entited, "Method and Apparatus for Determining Minority Carrier Diffusion Length in Semiconductors." Comparatively larger values of diffusion length (L) are a measure of the improvement attained in the practice of this invention. The diffusion length was found to be greater when the screen surface 42 was used and the substrate 28 was floating, that is, when the substrate 28 was not biased or connected to any electrical potential of the system, than when the screen surface 42 was not used, other plasma conditions being the same.

In addition, the quality of the amorphous silicon films was evaluated by infrared absorption spectrum measurements of the type well known in the art. The films prepared using the centrally disposed gas inlet disc 44 had a smaller concentration of a certain species characterized by infrared absorption at 840 $cm^{-1}$ and 890 $cm^{-1}$ whose presence is believed to be associated with recombination centers and where the presence of such centers is accompanied by reduced photo-generated current that occurs in the amorphous silicon film when used as a solar cell, for example.

The deposition rate of the amorphous silicon to develop the film 40 was found when the screen surface 42 was in place to be 0.5 times the rate when no screen surface 42 was used. Thus, the reduction of the deposition rate is somewhat greater than that given by the transmission of the screen surface 42, indicating thereby that some reactive species were lost in transit through the space 26 between the screen surface 42 and the substrate 28.

The property of the minority diffusion length (L) in micrometers of a group of different films of amorphous silicon deposited according to the invention were as follows:

DIODE MODE (FIG. 1) with floating substrate (30):
 Without a Screen (42), L had values between 0.05-0.10 $\mu m$;
 With a Screen (42), L=0.25 $\mu m$;
MAGNETRON MODE (FIGS. 1 & 2):
 Without a Screen (42), L had values between 0.07-0.16 $\mu m$;
 (The use of either a floating or grounded substrate (32a) did not affect the results); With a Screen (42) and a floating substrate L had values between 0.44-0.57 $\mu m$;
 With a Screen (42) and a grounded substrate (32a) L=0.20 $\mu m$.

All other operating conditions such as the power, gas supply and temperature of the substrate were held constant for the same values for each of the above tests.

Various modifications of the embodiments described can be made in the practice of this invention. For example, the screen surface 42 can be formed with a solid metallic side wall having only the bottom surface 43 formed as a screen. In this way unwanted specie from the region 13 diffusing into region 45 is reduced. Moreover, the RF field is better confined to the region 45. Furthermore, any of the conventional reactive gases useful in glow discharge deposition systems can be used.

What is claimed:

1. In a plasma deposition reactor apparatus having a reaction chamber for depositing a thin film of material on a substrate surface from a reactive radio frequency (RF) glow discharge, comprising a cathode connected to an RF power supply, and an anode for establishing a glow discharge region, characterized by:

means for confining the RF field from said RF power supply to a region within said chamber comprising said cathode and said anode to confine thereby a glow discharge of a reactive gas in said region;

said confining means including a perforated screen electrically connected to said anode and positioned between said anode and said cathode to confine the glow discharge in the region between the cathode and the screen said screen having openings which will permit diffusion of reactive gas species to said substrate;

means for positioning a substrate near said screen but not in said glow discharge region; and means for conducting reactive gas into the glow discharge region;

said gas means including a distribution head coupled to a source of reaction gas and positioned centrally within the glow discharge region.

2. The apparatus of claim 1 wherein said screen has a transmission of at least 0.5.

3. The apparatus of claim 2 wherein the openings in said screen are small enough so as not to disturb the plasma boundary of the glow discharge generated between said screen and said cathode.

4. The apparatus of claim 1 further characterized by said reactor comprised of a reaction chamber defined by a hollow metallic housing having an aperture, said cathode comprising an electrically conductive plate over said aperture and electrically insulated from said housing, said cathode plate being electrically connected to said RF power supply, and means for electrically grounding said housing relative to said RF power supply.

5. The apparatus of claim 4 further characterized by an array of permanent magnets positioned over said cathode plate to effect a closed-loop magnetic field to confine the plasma to a ring-shaped region parallel to said cathode.

6. The apparatus of claims 1, 2, or 3 wherein said screen is formed with solid side walls and a front wall having said openings, said front wall positioned to face generally normal to the position of said substrate whereby reactive gas species from said glow discharge tend to diffuse directly to said substrate.

* * * * *

UNITED STATES PATENT AND TRADEMARK OFFICE
CERTIFICATE OF CORRECTION

PATENT NO. : 4,450,787

DATED : May 29, 1984

INVENTOR(S) : Weakliem et al.

It is certified that error appears in the above-identified patent and that said Letters Patent is hereby corrected as shown below:

```
Title page "[22] Filed:  May 29, 1984" should be
          --[22] Filed:  June 9, 1982--
```

Column 9, line 23 "screen said" should be --screen, said--

Signed and Sealed this

Twenty-ninth Day of January 1985

[SEAL]

Attest:

DONALD J. QUIGG

Attesting Officer    Acting Commissioner of Patents and Trademarks